US007447955B2

(12) United States Patent
Niijima et al.

(10) Patent No.: US 7,447,955 B2
(45) Date of Patent: Nov. 4, 2008

(54) TEST APPARATUS AND TEST METHOD

(75) Inventors: Hirokatsu Niijima, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 421 days.

(21) Appl. No.: 11/290,610

(22) Filed: Nov. 30, 2005

(65) Prior Publication Data
US 2007/0136625 A1 Jun. 14, 2007

(51) Int. Cl.
*G11C 29/00* (2006.01)
(52) U.S. Cl. .............................. 714/718; 714/5; 714/25; 714/719; 714/720; 714/723; 714/734; 714/736; 714/742; 714/746; 714/819; 365/200; 365/201
(58) Field of Classification Search ................. None
See application file for complete search history.

(56) References Cited

U.S. PATENT DOCUMENTS

| 4,939,694 | A | * | 7/1990 | Eaton et al. | 365/200 |
| 7,096,397 | B2 | * | 8/2006 | Kundu et al. | 714/732 |
| 2002/0104045 | A1 | * | 8/2002 | Cooper | 714/42 |
| 2004/0223358 | A1 | * | 11/2004 | Yamamoto | 365/145 |
| 2005/0047229 | A1 | * | 3/2005 | Nadeau-Dostie et al. | 365/201 |

OTHER PUBLICATIONS

A High Density NAND Flash Memory Technology for a Silicon Movie Era Author: K. Sakui of Toshiba Corporation Semiconductor Company as Published in FED, vol. 11, No. 3 (2000) pp. 76-88.
International Search Report and Written Opinion of the Searching Authority for International Application No. PCT/JP2006/323527, mailed Feb. 15, 2007, 9 pages.

* cited by examiner

Primary Examiner—John P Trimmings
(74) Attorney, Agent, or Firm—Osha · Liang LLP

(57) ABSTRACT

There is provided a test apparatus for testing a memory-under-test for storing data strings to which an error correcting code has been added, having a logical comparator for comparing each data contained in the data string read out of the memory-under-test with an expected value generated in advance, a data error counting section for counting a number of data inconsistent with the expected value, a plurality of registers, provided corresponding to each of a plurality of classes, for storing an upper limit value of a number of errors contained in the data -under-test to be classified into the class, comparing sections for comparing each of the plurality of upper limit values stored in the plurality of registers with the counted value of the data error counting section and a classifying section for classifying the memory-under-test into the class corresponding to the register storing the upper limit value which is greater than the counted value.

8 Claims, 6 Drawing Sheets

| BLOCK TYPE | NUMBER OF FAILS | CLASSES ||||
|---|---|---|---|---|---|
| | | C1 | C2 | C3 | C4 |
| NORMAL | 0 | G | G | G | G |
| NORMAL | 0 | G | G | G | G |
| NORMAL | 1 | G | G | G | G |
| NORMAL | 2 | B | G | G | G |
| ABNORMAL | 0 | B | B | B | B |
| NORMAL | 4 | B | B | B | G |
| NORMAL | 3 | B | B | G | G |
| NORMAL | 0 | G | G | G | G |
| NORMAL | 0 | G | G | G | G |
| NORMAL | 0 | G | G | G | G |

| 4 | 3 | 2 | 1 |
|---|---|---|---|

FIG. 6

TEST APPARATUS AND TEST METHOD

BACKGROUND OF THE INVENTION

1. Field of the Invention

The present invention relates to a test apparatus for testing a device-under-test such as a semiconductor device and to a program for functioning the test apparatus.

2. Related Art

Conventionally, a semiconductor test apparatus has used to logically compare an output of a memory-under-test with an expected value per test cycle and to detect Pass when they coincide and Fail when they are inconsistent as a result of the comparison. Therefore, the test apparatus has used to detect that the memory-under-test is defective if it detects Fail even once in the test of the memory-under-test such as a flash memory that is configured so that stored data is read in unit of page across a plurality of cycles and an error correcting code is added in unit of page.

Such flash memory sometimes causes non-permanent software errors by causing a program disturbing mode and by rewriting data in a storage cell other than that to be written. For occurrence of such error, see 'Large Capacity NAND Flash Memory Technology for Silicon Movie Era' written by Yasushi Sakuta, FED Journal, Vol. 11, No. 3, 2000, pp. 76-88. When such software error occurs in actual use conditions, a memory controller for controlling the flash memory corrects the error of the data read out of the flash memory.

The conventional semiconductor memory test apparatus detects a failure of the memory-under-test when it detects Fail in either test cycle. Accordingly, there is a case when the test apparatus detects the failure of the flash memory even when a range of errors that can be corrected by the error correcting code occurs in the flash memory.

Still more, depending on a flash memory to be tested, some are apt to cause errors by the software error as described above and some cause no error even one bit. Therefore, there is a need for classifying normally operable flash memories corresponding to a degree of hardly causing any error in order to decide its use and sales price for example.

Accordingly, it is an object of the invention to provide a test apparatus and a program that are capable of solving the above-mentioned problems. This object may be achieved through the combination of features described in independent claims of the invention. Dependent claims thereof specify preferable embodiments of the invention.

SUMMARY OF THE INVENTION

In order to solve the above-mentioned problems, according to a first aspect of the invention, there is provided a test apparatus for testing a memory-under-test for storing data strings to which an error correcting code has been added, having a logical comparator for comparing each data contained in the data string read out of the memory-under-test with an expected value generated in advance, a data error counting section for counting a number of data inconsistent with the expected value, a plurality of registers, provided corresponding to each of a plurality of classes, for storing an upper limit value of a number of errors contained in the data -under-test to be classified into the class, comparing sections for comparing each of the plurality of upper limit values stored in the plurality of registers with the counted value of the data error counting section and a classifying section for classifying the memory-under-test into the class corresponding to the register storing the upper limit value which is greater than the counted value.

In the test apparatus, the memory-under-test may output data of a plurality of bits per cycle, the data error counting section may count a number of bits inconsistent with the expected value of the bit per each bit of the data, and the comparing section may compare each of the plurality of upper limit values with a total value of the number of errors per bit counted by the data error counting section.

Still more, in the test apparatus, the logical comparator may compare data which is outputted out of the memory-under-test and whose bit value changes with a logical value set in advance by a plural times per each of the bits, and the test apparatus may further include a timing detecting section for detecting timing when the bit value has changed based on a ratio of a number of times when the bit value has coincided with the logical value set in advance to a number of times when the bit has been compared with the logical value set in advance.

The test apparatus may further include a counted value changing section for outputting a value greater than any upper limit value to the comparing section as the counted value when there exits data inconsistent with the expected value in an operation mode for detecting a failure of the memory-under-test when there exists data inconsistent with the expected value.

In the test apparatus, the memory-under-test may have a plurality of blocks each of which contains the data string, the classifying section may classify each of the plurality of blocks into classes corresponding to the register storing the upper limit value which is equal to or greater than the number of errors contained in the block and the classifying section may also classify the memory-under-test into one class under the condition that a number of blocks classified into one class or into another class wherein the upper limit value is greater than that of the one class is equal to or less than an upper limit value set in advance.

Still more, in the test apparatus, the classifying section may detect a failure of the memory-under-test when the counted value exceeds the upper limit value stored in a predetermined register among the plurality of registers.

In the test apparatus, the classifying section may also detect the failure of the memory-under-test when the counted value exceeds the upper limit value that is a maximum number of errors in the data string correctable by the error correcting code.

When the memory-under-test has a first storage area for storing data strings to which error correcting code has been added and a second storage area for storing data strings to which no error correcting code has been added, the classifying section in the test apparatus may classify the memory-under-test corresponding to the counted value of the data string read out of the first storage area and may detect a failure of the memory-under-test when at least one data contained in the data string is inconsistent with the expected value as for the data string read out of the second storage area.

In the test apparatus, the logical comparator may sequentially compare each of the data contained in the data string with the expected value for each of the plurality of data strings read out of different storage areas of the memory-under-test, the data error counting section may increment the counted value every time when the data inconsistent with the expected value is detected for each of the data string, the classifying section may detect a failure of the memory-under-test when the counted value of the data error counting section exceeds the upper limit value and the test apparatus may further include a test processing section for initializing the counted value and causing the logical comparator to start comparison of next data string with the expected value when detection of a failure of one of the data strings is completed.

According to a second aspect of the invention, there is provided a test method for testing a memory-under-test for storing data strings to which an error correcting code has been added, including steps of comparing each data contained in the data string read out of the memory-under-test with an expected value generated in advance, counting a number of the data that does not coincide with the expected value, storing, corresponding to each of a plurality of classes, an upper limit value of a number of errors contained in the data -under-test to be classified into the class, comparing each of the plurality of stored upper limit values with the counted value, and classifying the memory-under-test into a class corresponding to a register storing the upper limit value which is equal to or greater than the counted value.

It is noted that the summary of the invention described above does not necessarily describe all necessary features of the invention. The invention may also be a sub-combination of the features described above.

BRIEF DESCRIPTION OF THE DRAWINGS

FIG. 6 is a table showing one exemplary error detected by the classifying module of the embodiment of the invention.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
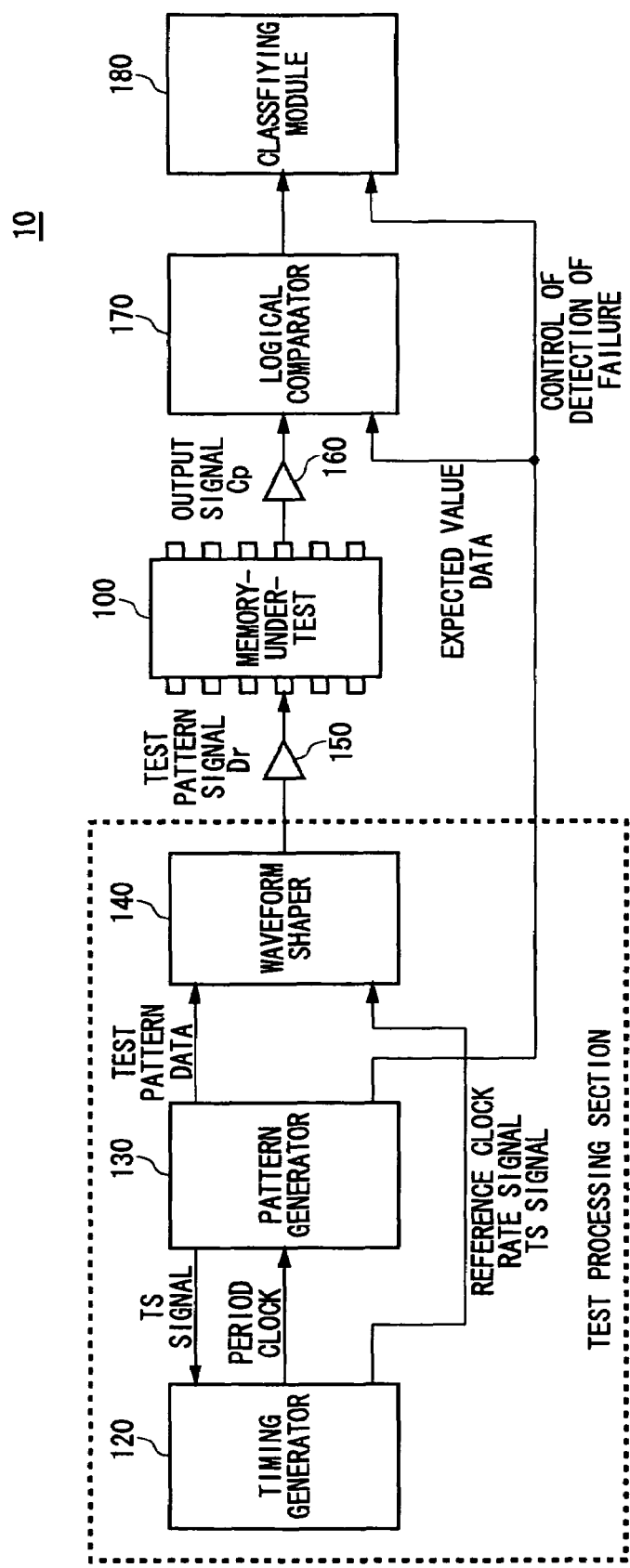
FIG. 1 is a diagram showing a configuration of a test apparatus according to an embodiment of the invention.

FIG. 1 is a diagram showing a configuration of a test apparatus 10 according to an embodiment of the invention. The test apparatus 10 tests a memory function of a memory-under-test (MUT) 100. Here, the MUT 100 is a semiconductor chip or a SoC (system-on-chip) to which a memory function is added and stores data strings to which an error correcting code is added. Even when the data string read out of the MUT 100 is inconsistent with an expected value data string, the test apparatus 10 of the present embodiment does not judge the MUT 100 to be defective as long as it is correctable by the error correcting code. Still more, even when the data string readout of the MUT 100 is correctable by the error correcting code, the test apparatus 10 classifies the quality of the MUT 100 corresponding to a number of errors caused in the data string. Thus, the test apparatus 10 aims at adequately judging the failure of the MUT 100 and at adequately controlling the quality of the MUT 100. This will be explained below by exemplifying a case when the MUT 100 is a flash memory.

The test apparatus 10 has a test processing section 110, a driver 150, a comparator 160, a logical comparator 170 and a classifying module 180. The test processing section 110 controls the test of the MUT 100. More specifically, in the test of the MUT 100, the test processing section 110 writes a data string into the same storage area of the MUT 100 by plural times and reads the written data string out of the MUT 100 everytime when it is written. Thereby, the test processing section 110 feeds the data read out of the MUT 100 to the logical comparator 170. Thus, the test processing section 110 can cause the logical comparator 170 and the classifying module 180 to detect the failure of the memory cell in the storage area by writing and reading data into and out of the same storage area while changing the data string.

The test processing section 110 has a timing generator 120, a pattern generator 130 and a wave form shaper 140. The timing generator 120 generates a period clock indicating one cycle of the test and a RATE signal indicating starting timing of the test cycle by using timing data specified by a timing set signal (TS signal) outputted out of the pattern generator 130. Then, the timing generator 120 feeds the period clock to the pattern generator 130 and feeds the RATE and TS signals to the waveform shaper 140 together with a reference clock of the test apparatus 10.

The pattern generator 130 generates test pattern data to be fed to the MUT 100 based on the period clock and feeds it to the waveform shaper 140. This test pattern data contains a test pattern composed of signals to be fed to the MUT 100 to write the data string into the MUT 100 and a test pattern composed of signals to be fed to the MUT 100 to read the written data string out of the MUT 100.

The waveform shaper 140 shapes the test pattern data into a waveform of timing to be fed to the MUT 100 based on the reference clock, the RATE signal and the TS signal.

The driver 150 feeds the test pattern data shaped by the waveform shaper 140 to the MUT 100 as a test pattern signal. The comparator 160 compares an output signal outputted out of the MUT 100 corresponding to the test pattern with reference voltage set in advance to obtain a logical value of the output signal.

The logical comparator 170 compares each data contained in the data string read out of the MUT 100 corresponding to the test pattern with an expected value generated in advance by the pattern generator 130. The classifying module 180 classifies the MUT 100 into either one of a plurality of classes or judges whether or not the MUT 100 is defect-free based on the comparison result of the logical comparator 170.

Figure 2:
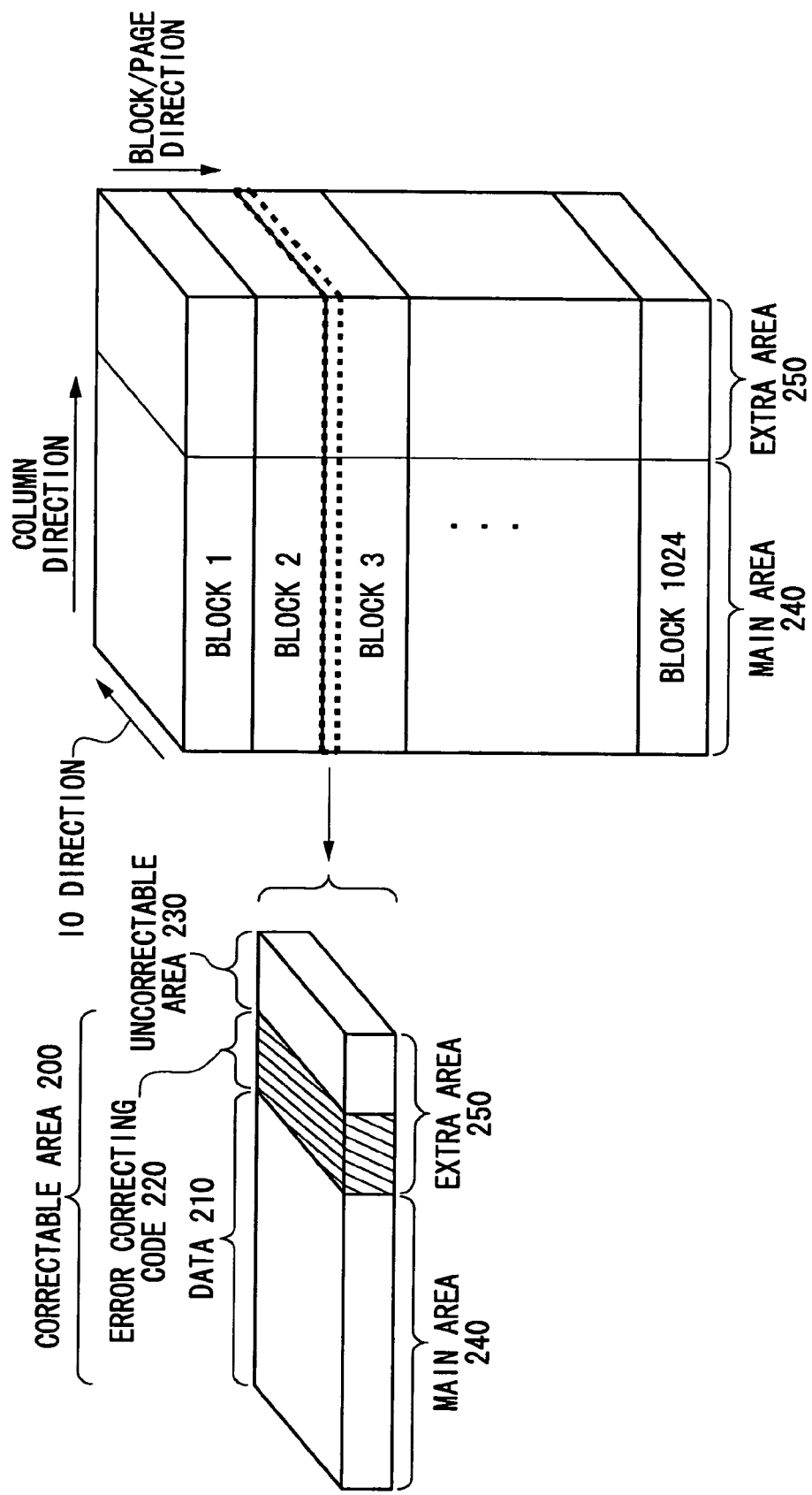
FIG. 2 is shows a storage area of a memory-under-test according to the embodiment of the invention.

FIG. 2 shows the storage area of the MUT 100 according to the embodiment of the invention. The storage area of the MUT 100 of the embodiment is divided into a plurality of blocks. Each block has a data storage capacity of 64 KB for example and is composed of a plurality of pages such as 32. The MUT 100 of the embodiment reads/writes data strings in unit of page having a data storage capacity of 2 KB for example. More specifically, the MUT 100 has a plurality of data 10 terminals such as 8 bits and transfers data of one word (e.g., 8 bits) per one input/output cycle via the plurality of data 10 terminals. Then, it reads/writes in the unit of page by transferring each word within the page sequentially in the column direction in one reading/writing process.

The storage area within the MUT 100 includes a main area 240 and an extra area 250. The main area 240 is an area where the MUT 100 stores data 210 to be stored. The extra area 250 is an area where an error correcting code 220 for correcting a bit error caused in the data 210 and information for prohibiting the use of the pertinent page are stored. The storage area within the MUT 100 maybe also divided into a correctable area 200 and an uncorrectable area 230 from the point of view of corrigibility of error. The correctable area 200 is one example of a first storage area according to the present invention, for storing data strings to which the error correcting code is added by storing the data 210 and the error correcting code 220. When a bit error occurs within the correctable area 200 in actually using the MUT 100, a memory controller that is connected with the MUT 100 and controls the MUT 100 can correct the error within a correctable range by the error correcting code 220. Meanwhile, the uncorrectable area 230 is one example of a second storage area according to the present invention and is an area for storing data strings to which no error correcting code is added. The memory controller is unable to correct the bit error when it occurs within the uncorrectable area 230.

Figure 3:
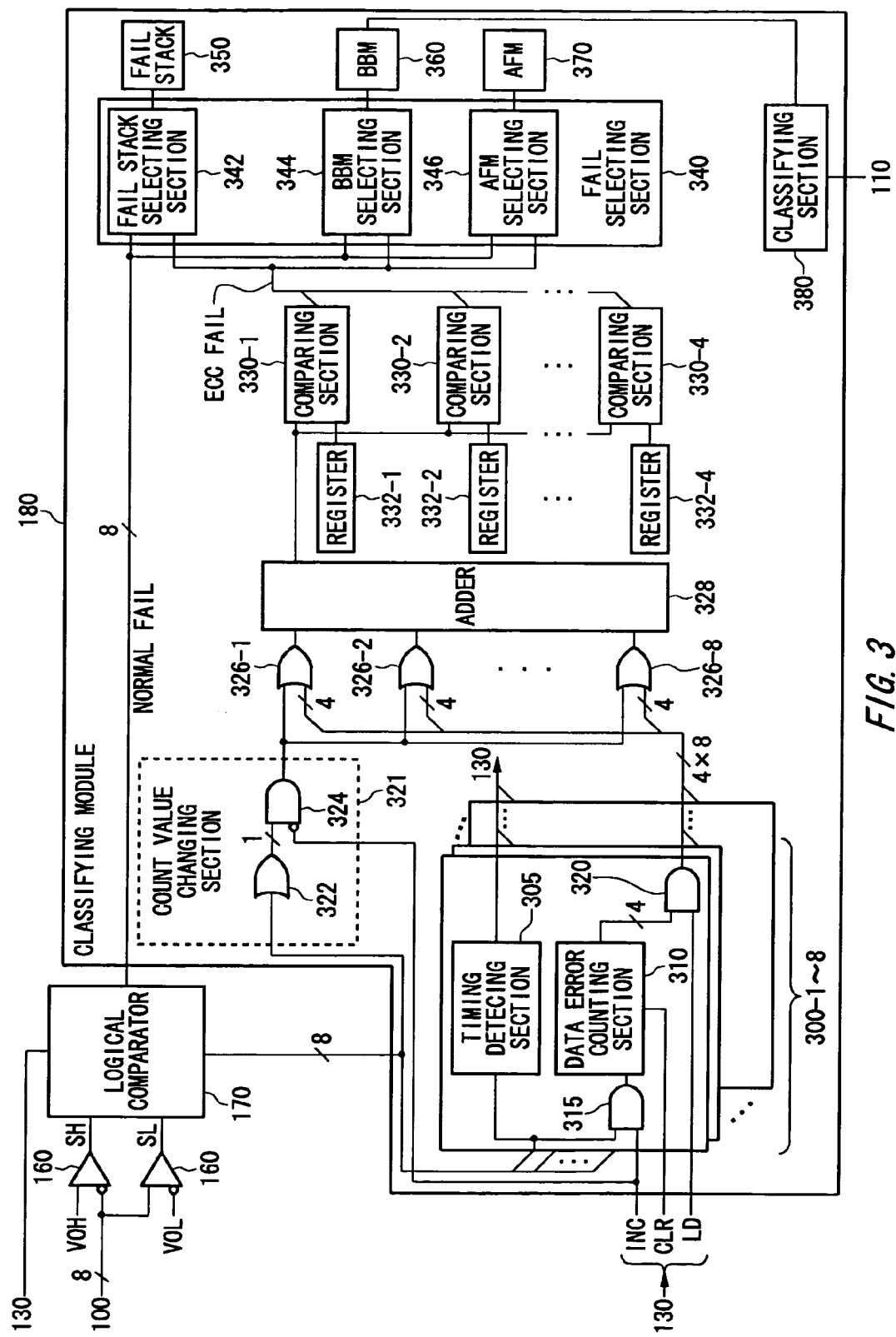
FIG. 3 is a diagram showing a configuration of a classifying module together with a comparator and a logical comparator according the embodiment of the invention.

FIG. 3 is a diagram showing a configuration of the classifying module 180 together with the comparator 160 and the logical comparator 170 according to the embodiment of the invention. As for each of the plurality of data strings read out of different storage areas within the MUT 100, the comparator 160 receives each data contained in the data string sequentially from the data 10 terminal of the MUT 100 in unit of 8 bits to compare each voltage inputted from each bit with a threshold voltage VOH indicating a logical value H and a threshold voltage VOL indicating a logical value L. Then, the comparator 160 outputs SH =1 when the pertinent bit is logical value H and SL =1 when the bit is logical value L, per bit.

The logical comparator 170 tests the MUT 100 concerning to a plurality of different items. In a first test, the logical comparator 170 tests whether or not data can be written correctly into each bit of the MUT 100. In this test, the logical comparator 170 compares each data contained in the data string sequentially with an expected value for each of the plurality of data strings. More specifically, the logical comparator 170 of the present embodiment compares the data of one word (=8 bits) with the expected value of one word per bit per one input/output cycle and outputs the comparison result as a Pass/Fail signal indicating a coincident bit as 0 (signal indicating Pass) and an inconsistent bit as 1 (signal indicating Fail).

In a second test, the logical comparator 170 tests timing by which data of each bit is read out of the MUT 100. In this test, the logical comparator 170 compares data which is outputted out of the MUT 100 and whose bit value changes with a predetermined logical value by plural times for each bit contained in the data string at the point of time when a preset period has elapsed since when a data reading request has been issued to the memory controller of the MUT 100. Thereby, the data reading timing may be tested by comparing one and same bit by 100 times for example and by checking how many times among them the value coincides with the logical value.

The classifying module 180 has processing sections 300-1 through 300-8, a counted value changing section 321, OR gates 326-1 through 326-8, an adder 328, comparing sections 330-1 through 330-4, registers 332-1 through 332-4, a fail selecting section 340, a fail stack 350, a BBM 360, an AFM 370 and a classifying section 380. Each of the processing sections 300-1 through 300-8 receives the Pass/Fail signal per bit from the logical comparator 170. That is, the processing section 300-1 receives the pass/fail signal of the first bit among the data of one word and each of the processing sections 300-2 through 300-8 receives the pass/fail signal from the second bit to the eighth bit, respectively.

The processing section 300-1 has a timing detecting section 305, a data error counting section 310 and AND gates 315 and 320. The timing detecting section 305 is provided for the purpose of the second test described above and calculates a ratio of a number of times when the pertinent bit value coincides with its logical value set in advance to a number of times of comparison of each bit with the preset logical value based on the received pass/fail signal. Then, based on that ratio, the timing detecting section 305 detects timing when the value of each bit has changed. When each bit coincides with the preset Logical value by 50 times among 100 times of comparison for example, the timing detecting section 305 judges that the data of that bit has changed at a point of time when a preset period has elapsed since the read request has been issued.

The AND gate 315 outputs AND of each bit of the pass/fail signal and an INC signal indicating a period of time during which a number of fail signals is counted to the data error counting section 310. Thereby, the AND gate 315 feeds the pass/fail signal to the data error counting section 310 during the period of time during which the number of fail signals is to be counted and outputs a value 0 to the data error counting section 310 during a period of time during which the number of fail signals is not counted. For each data string read out of the MUT 100, the data error counting section 310 counts a number of data inconsistent with the expected value generated in advance among data contained in that data string. That is, for each data string, the data error counting section 310 adds the number of bits inconsistent with the expected value of that bit per each bit of the data contained in that data string.

Here, the number of countable fail signals of the data error counting section 310 may be limited. For example, the data error counting section 310 may store the number of data bits inconsistent with the expected value by four bits or may stop the addition of value to the counter when the number of counted fail signals is 15.

Still more, when the data error counting section 310 receives a CLR signal from the pattern generator 130, it initializes the counted value, i.e., it zeroes the counted value.

It is noted that each of the processing sections 300-2 through 300-8 conduct almost same operations with that of the processing section 300-1 described above for each of the second bit to the eighth bit. Their concrete configuration is almost same with that of the processing section 300-1, so that their explanation will be omitted here.

When the AND gate 320 receives a LD signal from the pattern generator 130, it outputs AND of the counter value and the LD signal (i.e., the counter value itself) to the OR gate 326-1. Each of the OR gates 326-1 through 326-8 finds AND of the inputted counter value and an output of an AND gate 324 and outputs it to the adder 328. It is noted that while the output of the AND gate 324 will be described in detail later, the output of the AND gate 324 becomes 0 when the INC signal is the logical value "1", giving no influence on the output of the OR gates 326-1 through 326-8. The adder 328 sums the counter values outputted out of the OR gates 326-1 through 326-8 and outputs it to each of the comparing sections 330-1 through 330-4.

Each of the registers 332-1 through 332-4 is provided corresponding to each of a plurality of classes for classifying the MUT 100 by its quality. Each of the registers 332-1 through 332-4 stores an upper limit value of a number of errors contained in the data string even for the MUT 100 to be classified into the corresponding class. Each of the comparing sections 330-1 through 330-4 compares each of the plurality of upper limit values stored in the registers 332-1 through 332-4 with a total value of the number of errors per bit counted by the data error counting section 310.

When the INC signal is the logical value "0", the test apparatus 10 operates in an operation mode of detecting a failure of the MUT 100 when data inconsistent with the expected value exists regardless of the number of bits causing the fail signal. When there exists data inconsistent with the expected value in this operation mode, the counted value changing section 321 outputs a value greater than any upper limit values stored in the registers 332-1 through 332-4. As a concrete configuration for realizing this operation mode, the counted value changing section 321 has an OR gate 322 and the AND gate 324. The OR gate 322 receives the pass/fail signal of each bit of the first through eighth bits from the logical comparator 170 and outputs their OR to the AND gate 324. That is, when Fail is detected in either bit of the first through eighth bits, a logical value "1" is outputted to the AND gate 324. The AND gate 324 finds AND of the output of the OR gate 322 and negation of the INC signal received from the pattern generator and outputs it to the OR gates 326-1 through 326-8. Because each of the OR gates 326-1 through 326-8 receives the input of logical value "1", they output a maximum value (=15) which can be expressed by four bits to the adder 328. Then, the adder 328 outputs a total of these maximum values to the comparing sections 330-1 through 330-4. Thus the counted value changing section 321 allows the value greater than any upper limit values stored in the registers 332-1 through 332-4 to be outputted to the comparing sections 330-1 through 330-4 as the counted value. In this case, the comparison result of the comparing sections 330-1 through 330-4 becomes the same with the case when the data error counting section 310 outputs the value greater than any upper limit values stored in the registers 332-1 through 332-4.

The comparison result compared by the respective comparing sections 330-1 through 330-4 is outputted to the fail selecting section 340 as ECC Fail notifying the failure of the MUT 100 in unit of data string. The fail selecting section 340 receives this Ecc fail signal and the normal fail signal that is the pass/fail signal per input/output cycle. The fail selecting section 340 has a fail stack selecting section 342, a BBM selecting section 344 and an AFM selecting section 346. The fail stack selecting section 342 selects a failure based on either the normal fail signal or the Ecc fail signal to be stored in a fail stack 350 for storing whether or not the failure of the MUT 100 has been detected per unit of the MUT 100. When the failure based on the normal fail signal is to be stored, the fail stack 350 stores that the MUT 100 is defective if at least one data is inconsistent with the expected value. Meanwhile, when the failure based on the Ecc fail signal is to be stored, as for a correctable data string, the fail stack 350 stores that the MUT 100 is defective when the data exceeding the upper limit value contained in that data string is inconsistent with the expected value.

The BBM selecting section 344 selects a failure based on either the normal fail signal or the Ecc fail signal to be stored in a BBM (Bad Block Memory) 360 for storing No. of block in which a failure is detected. When the failure based on the normal fail signal is to be stored, the BBM 360 stores that the MUT 100 is defective with regard to a certain block if at least one data within a data string contained in the block is inconsistent with the expected value. Meanwhile, as for a correctable data string contained in a certain block, the BBM 360 stores information indicating a number of errors contained in the data string based on the Ecc fail signal. It enables the classifying section 380 described later to classify the MUT 100 into either one of the plurality of classes. It also enables the failure of the MUT 100 to be detected when a number of errors uncorrectable even by the error correcting code occurs.

The AFM selecting section 346 selects the failure based on either the normal fail signal or the Ecc fail signal to be stored to an AFM (Address Failure Memory) 370 for storing fail signals per address. When the failure based on the normal fail signal is to be stored, the AFM 370 stores that the data outputted out of the MUT 100 is inconsistent with the expected value to the address corresponding to that data.

A user or the like of the test apparatus 10 makes the above selection in advance. More specifically, in detecting the failure of the MUT 100 based on whether or not errors can be corrected, the fail stack selecting section 342 and the BBM selecting section 344 are selected so as to store the failure in the fail stack 350 and the BBM 360 based on the Ecc fail signal and the AFM selecting section 346 is selected so as to store the failure in the AFM 370 based on the normal fail signal.

The classifying section 380 classifies each of the plurality of blocks corresponding to a number of errors contained in the block based on the BBM 360. That is, if the number of errors contained in a certain block is less than the upper limit value set in advance, the classifying section 380 classifies that block into a class corresponding to the register storing that upper limit value. Still more, corresponding to a number of blocks classified into each class, the classifying section 380 classifies the MUT 100 containing those blocks. The result of classification is notified to the test processing section 110. The classifying section 380 may also detect the failure of the MUT 100 when the counted value indicating the number of errors contained in the MUT 100 exceeds an upper limit number (e.g., a maximum value of the upper limit value stored in each register) stored in a predetermined register among the registers 332-1 through 332-4.

Figure 4:
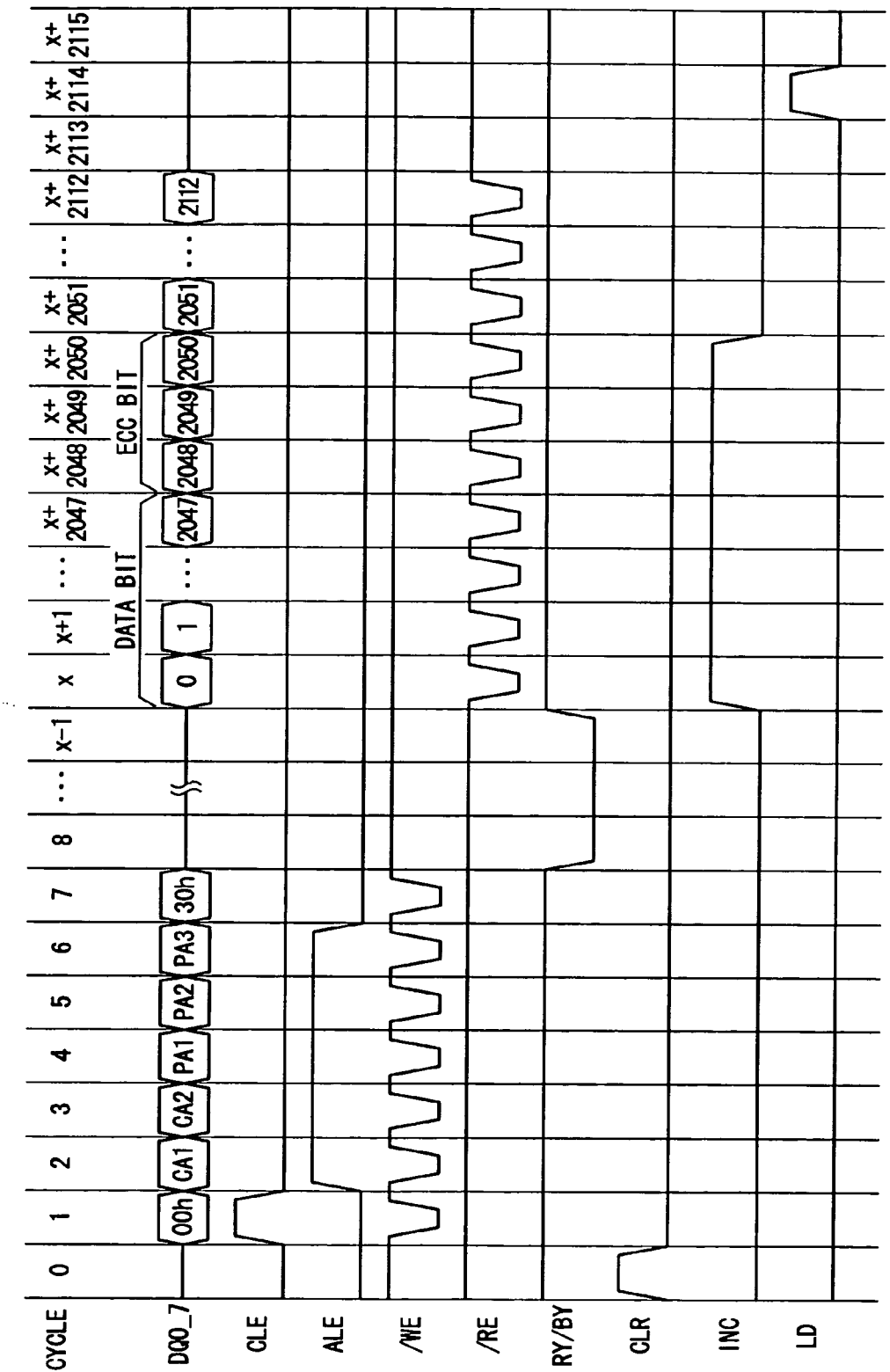
FIG. 4 is a chart showing operation timing of the test apparatus according to the embodiment of the invention.

FIG. 4 is a chart showing operation timing of the test apparatus 10 of the embodiment. The test processing section 110 writes test data into each page of the MUT 100. Then, the test processing section 110 reads the written data out of each page to compare with an expected value. FIG. 4 shows the operating timing of the part of reading the data written into a certain page out of the MUT 100 to compare with the expected value.

Prior to reading out a data string anew to compare with the expected value, the pattern generator 130 sets the CLR signal at "1" to initialize the counted value of the data error counting section 310 at first (Cycle 0). Next, the test processing section 110 feeds a memory read command to the MUT 100 based on the test pattern data (Cycles 1 through 7). More specifically, the test processing section 110 feeds the command in Cycle 1, column addresses in Cycle 2 to 3 and page addresses in Cycles 4 through 6 to start the process for reading the MUT 100.

Next, corresponding to the read command, the MUT 100 sequentially outputs the data contained in the data string stored in the specified page by one word each (Cycle x through Cycle x+2112). Here, the MUT 100 outputs the data 210 within the correctable area 200 between Cycle x and Cycle x+2047 and outputs the error correcting code 220 within the correctable area 200 between Cycle x+2048 and Cycle x+2050. Since these data are correctable by the error correcting code, the pattern generator 130 sets the INC signal at "1". It prohibits the OR gates 322 and 324 from notifying a single bit error. Further, the AND gate 315 and the data error counting section 310 start to count a number of fail bits. As a result, as for the data string read out of the correctable area 200, the classifying section 380 can detect a failure of the MUT 100 when the counted value exceeds the upper limit value that is the maximum number of errors of the data string correctable by the error correcting code.

Next, the MUT 100 outputs data within the uncorrectable area 230 during a period between Cycle x+2051 and Cycle x+2112. Because those data are uncorrectable, the pattern generator 130 sets the INC signal at "0". It permits the OR gates 322 and 324 to notify the single bit error. Still more, the AND gate 315 and the data error counting section 310 stop to count a number of fail bits. As a result, as for the data string read out of the uncorrectable area 230, the classifying section 380 can detect a failure of the MUT 100 when at least one data contained in the data string is inconsistent with the expected value.

Next, after finishing the comparison of the data string with the expected value data string, the pattern generator 130 sets the LD signal at "1". Corresponding to that, the counted value of the data error counting section 310 is fed to the adder 328 via the OR gates 326-1 through 326-8. Receiving that, the comparing sections 330-1 through 330-4 compare the counted value with each of the upper limit values stored in the registers 332-1 through 332-4. This comparison result is stored in the BBM selecting section 344 and based on that, the classifying section 380 can classify the MUT 100 into either one class.

Through the processes described above, the test apparatus 10 can read the data string written into the MUT 100 and can detect the failure of the MUT 100 concerning to that data string or can classify the MUT 100 into a certain class. Then, when the detection of the failure of a certain data string is completed, the test processing section 110 initializes the counted value within the data error counting section 310 by setting the CLR signal at "1". Then, the pattern generator 130 causes the logical comparator 170 to start the comparison of the next data string with the expected value.

The test apparatus 10 described above permits the inconsistency of the data with the expected value within the error correctable range of the data string stored in the correctable area 200 and classifies the MUT 100 corresponding to a number of inconsistent bits. Meanwhile, as for the data string stored in the uncorrectable area 230, the test apparatus 10 detects the failure of the MUT. 100 when it detects at least one fail. Thereby, the test apparatus 10 can adequately detect the failure of the MUT 100 and can adequately classify the MUT 100 corresponding its quality.

Figure 5:
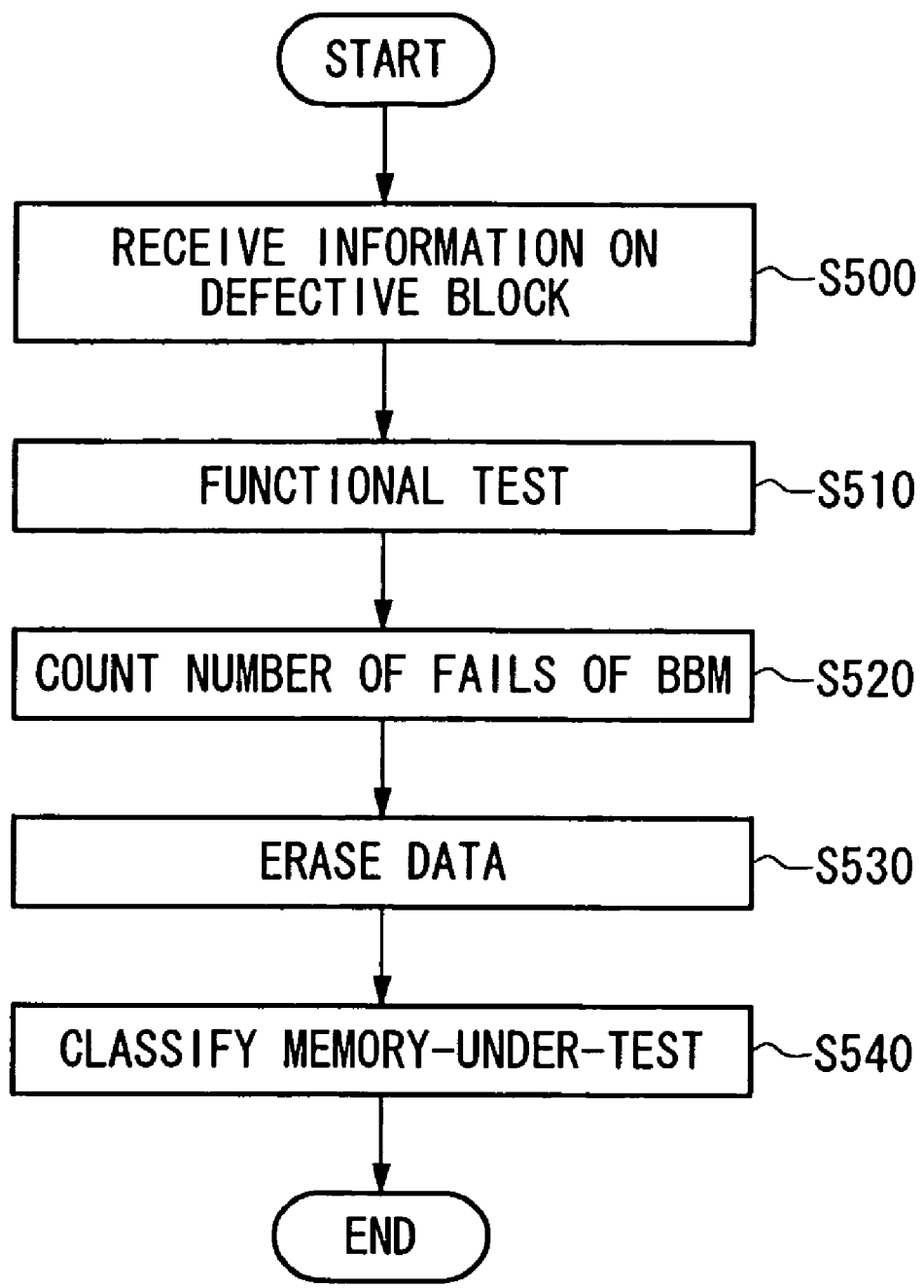
FIG. 5 is a flowchart showing a flow of processes for classifying the memory-under-test by the test apparatus of the embodiment of the invention.

FIG. 5 is a flowchart showing a flow of the processes for classifying the MUT 100 by the test apparatus 10 of the embodiment. The classifying module 180 receives information indicating a defective block unsuitable for reading/writing data among the plurality of blocks contained in the MUT 100 from the test processing section 110 (S500). This defective block has been clarified in advance by a wafer test or the like carried out in manufacturing the MUT 100. Next, the test apparatus 10 carries out a functional test of reading the data string recorded in each bit of the MUT 100 to compare with the expected value data string (S510). The comparison result obtained by the logical comparator 170 through this functional test is recorded in the BUM 360 (S520).

Next, the test apparatus 10 erases data of each bit recorded in the MUT 100 to prepare for the next test or for shipping the product after finishing the test (S530). Then, based on the comparison result of the logical comparator 170, the classifying module 180 classifies the MUT 100 into either one of the plurality of classes or judges whether or not the MUT 100 is defect-free (S540).

More specifically, the classifying section 380 within the classifying module 180 classifies the MUT 100 corresponding to the counted value for the data string read out of the correctable area 200. Still more, as for the data string read out of the uncorrectable area 230, the classifying section 380 detects the failure of the MUT 100 when at least one data contained in this data string is inconsistent with the expected value.

FIG. 6 is a table showing one example of an error detected by the classifying module 180 of the present embodiment. C1 through C4 in FIG. 6 denote the plurality of classes for classifying the MUT 100 by the classifying section 380. In classifying the MUT 100, the classifying section 380 classifies each block contained in the MUT 100 into the plurality of classes at first. That is, the classifying section 380 classifies a block whose number of errors is an upper limit value of two or more into the class C1, classifies a block whose number of errors is an upper limit value of three of more into the class C2, classifies a block whose number of errors is an upper limit value of four or more into the class C3 and classifies a block whose number of errors exceeds those upper limit values into the class C4. When a block applies to anyone of the plurality of classes, the classifying section 380 classifies that block into the class whose upper limit value is greater.

For example, a block of the third line has a number of errors of 1 that is less than the least upper limit value of 2, so that it is not classified into any class. In FIG. 6, G (GOOD) denotes the non-classified state in the meaning of a good product having fewer errors. Still more, B (BAD) denotes the classified state in the meaning of bad condition, causing errors. A block of the fourth line has a number of errors of 2 that is the upper limit value of 2 or more, so that it is classified into the class C1. A block of the sixth line has a number of errors of four that is equal to the upper limit value of four, so that it is classified into the class C3. It is noted that a block of the fifth line is the block already specified by the information indicating a defective block in S500 in FIG. 5, so that it is out of object of the test of the test apparatus 10. Therefore, this block is classified into the class C4 beforehand.

Subsequently, the classifying section 380 calculates, for each class, a number of blocks classified into that class or to another class whose upper limit value is greater than that of that class. The calculation process is realized by summing a number of Bs (BADs) corresponding to each class. That is, the classifying section 380 can calculate a number of blocks classified into the class C1 or to the classes C2 through C4 whose upper limit value is greater than that of the class C1 as four by summing the number of Bs corresponding to the class C1 for example. Similarly to that, it can calculate a number of blocks classified into the class C2 or to the classes having the upper limit value greater than that as three and can calculate a number of blocks classified into the class C3 or to the classes having the upper limit value greater than that as two.

Then, under the condition that the number of blocks classified into a certain class or into another class corresponding to an upper limit value greater than that of the certain class is less than an upper limit value set in advance, the classifying section 380 correlates the MUT 100 to that class. As a result, if the upper limit value is 2 for example, the MUT 100 is classified into the class C3. Thus, the test apparatus 10 classifies the MUT 100 by handling the quality standard met at least by the preset number of blocks as the quality standard of the MUT 100. Thereby, the test apparatus 10 can classify the MUT 100 based on the both points of view of the number of operable blocks and the quality standard met by those blocks.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the present invention allows the memory-under-test to be classified corresponding to its quality in the testing step of the memory-under-test.

What is claimed is:

1. A test apparatus for testing a memory-under-test for storing data strings to which an error correcting code has been added, comprising:
   a logical comparator for comparing each of data contained in said data strings read out of said memory-under-test with an expected value generated in advance;
   a data error counting section for counting a number of data inconsistent with said expected value;
   a plurality of registers, provided corresponding to each of a plurality of classes, for storing an upper limit value of a number of errors contained in said data strings of said memory-under-test to be classified into the class;
   comparing sections for comparing each of said plurality of upper limit values stored in said plurality of registers with a counted value of said data error counting section; and
   a classifying section for classifying said memory-under-test into the class corresponding to said register storing said upper limit value that is greater than said counted value,
   wherein said logical comparator compares data outputted out of said memory-under-test, which includes a plurality of bits per cycle, with logical values set in advance, for each of the plurality of bits, and said test apparatus further comprises a timing detecting section for detecting timing when values of the bits change based on a ratio of a number of times when each of the values of the bits coincides with each of the logical values set in advance to a number of times when the values of the bits have been compared with the logical values set in advance, and
   wherein said classifying section detects a failure of said memory-under-test when said counted value exceeds said upper limit value which is a maximum number of errors in said data string correctable by said error correcting code.

2. The test apparatus as set forth in claim 1, wherein said data error counting section counts a number of error bits inconsistent with said expected value for each bit of said data; and said comparing section compares each of said plurality of upper limit values with a total value of the number of error bits counted by said data error counting section.

3. The test apparatus as set forth in claim 1, further comprising a counted value changing section for outputting a value greater than any upper limit value to said comparing sections as said counted value when there exists data inconsistent with said expected value in an operation mode for detecting a failure of said memory-under-test when there exists data inconsistent with said expected value.

4. The test apparatus as set forth in claim 1, wherein said memory-under-test has a plurality of blocks each of which contains said data string; said classifying section classifies each of said plurality of blocks into a class corresponding to said register storing said upper limit value that is equal to or greater than the number of errors contained in said block; and said classifying section also classifies said memory-under-test into one class under the condition that a number of blocks classified into one class or into another class wherein said upper limit value is greater than that of said one class is equal to or less than an upper limit value set in advance.

5. The test apparatus as set forth in claim 1, wherein said classifying section detects a failure of said memory-under-test when said counted value exceeds said upper limit value stored in a predetermined register among said plurality of registers.

6. The test apparatus as set forth in claim 5, wherein, in case of said memory-under-test has a first storage area for storing data strings to which error correcting code has been added and a second storage area for storing data strings to which no error correcting code has been added, said classifying section classifies said memory-under-test corresponding to said counted value of said data string read out of said first storage area and detects a failure of said memory-under-test when at least one data contained in said data string is inconsistent with said expected value as for said data string read out of said second storage area.

7. The test apparatus as set forth in claim 5, wherein said logical comparator sequentially compares each of said data contained in said data strings with said expected value for each of said plurality of data strings read out of different storage areas of said memory-under-test; said data error counting section increments the counted value every time when said data inconsistent with said expected value is detected for each of said data string; and said classifying section detects a failure of said memory-under-test when the counted value of said data error counting section exceeds said upper limit value; and said test apparatus further comprises a test processing section for initializing said counted value and causing said logical comparator to start comparison of next data string with said expected value when detection of a failure of one of said data strings is completed.

8. A test method for testing a memory-under-test for storing data strings to which error correcting code has been added, comprising steps of:
   comparing each data contained in said data strings read out of said memory-under-test with an expected value generated in advance;
   counting a number of said data that does not coincide with said expected value;
   storing, corresponding to each of a plurality of classes, an upper limit value of a number of errors contained in said data string of said memory-under-test to be classified into the class;
   comparing each of said plurality of stored upper limit values with said counted value; and
   classifying said memory-under-test into a class corresponding to a register storing said upper limit value that is equal to or greater than said counted value,
   wherein, in the case where said memory-under-test has a first storage area for storing data strings to which an error correcting code has been added and a second storage area for storing data strings to which no error correcting code has been added, said classifying includes classifying said memory-under-test corresponding to said counted value of said data strings read out of said first storage area and detecting a failure of said memory-under-test when at least one data contained in said data string is inconsistent with said expected value as for said data strings read out of said second storage area.

* * * * *